(12) United States Patent
Shiau (10) Patent No.: US 6,894,333 B2
(45) Date of Patent: May 17, 2005

(54) OXIDE LAYER OF VARIABLE THICKNESS BETWEEN WORD LINES AND BIT LINES OF A MEMORY DEVICE

(75) Inventor: Jiann-Ming Shiau, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 282 days.

(21) Appl. No.: 10/066,685

(22) Filed: Feb. 6, 2002

(65) Prior Publication Data

US 2002/0094645 A1 Jul. 18, 2002

Related U.S. Application Data

(62) Division of application No. 09/526,694, filed on Mar. 15, 2000, now Pat. No. 6,372,580.

(51) Int. Cl.[7] ............................................. H01L 27/108
(52) U.S. Cl. ...................................... 257/296; 257/325
(58) Field of Search ................................ 257/296–310, 257/325; 438/275–290

(56) References Cited

U.S. PATENT DOCUMENTS

| | | | |
|---|---|---|---|
| 4,011,105 A | 3/1977 | Paivinen et al. ............ 257/399 |
| 4,104,784 A | 8/1978 | Klein ........................... 257/392 |
| 4,212,684 A | 7/1980 | Brower ........................ 257/380 |
| 5,051,809 A | * 9/1991 | Kiyohara ..................... 257/211 |
| 5,633,187 A | 5/1997 | Hsu ............................. 438/275 |
| 5,712,203 A | 1/1998 | Hsu ............................. 438/275 |
| 5,854,109 A | * 12/1998 | Sheng et al. ................ 438/275 |
| 6,372,580 B1 | * 4/2002 | Shiau .......................... 438/275 |

* cited by examiner

Primary Examiner—Fetsum Abraham
(74) Attorney, Agent, or Firm—Finnegan, Henderson, Farabow, Garrett & Dunner, L.L.P.

(57) ABSTRACT

A high density mask-type read only memory (ROM) device and a method of fabricating the high density mask-type read only memory (ROM) device using a salicide process. The method utilizes buried N+ bit lines, thick oxides for forming non-programmable cells, thin gate oxides in regions in which the thick field oxide has been removed to form programmable cells, polysilicon gate structures as word lines, and deposition of a single silicide layer. Since only one silicide layer is deposited, the manufacturing process requires less steps. The resultant ROM device has a silicide layer over the word lines and portions of the buried bit lines that serves to reduce word line and bit line resistance. This results in a ROM device with improved operational speed of the memory cells.

5 Claims, 16 Drawing Sheets

OXIDE LAYER OF VARIABLE THICKNESS BETWEEN WORD LINES AND BIT LINES OF A MEMORY DEVICE

This is a division of application Ser. No. 09/526,694, filed Mar. 15, 2000 now U.S. Pat. No. 6,372,580, now allowed, which is incorporated herein by reference.

FIELD OF THE INVENTION

The present invention relates generally to a semiconductor memory device and a method for making the semiconductor memory device and, more particularly, to a high density mask-type programmable read-only memory and a self-aligned silicide process used for making the high density mask-type programmable read-only memory.

BACKGROUND OF THE INVENTION

Read-only memory (ROM) devices are semiconductor integrated circuits widely used in microprocessor-based systems to permanently store information even when power is off. ROM devices are particularly well suited for applications where a large volume of devices having identical data are required or for storing data that is repeatedly used. An example of such an application is the BIOS on personal computers. ROM devices store binary signals as an array of active elements that are typically programmed as part of the fabrication process by the integrated circuit manufacturer according to a customer's specifications.

Conventional mask ROM includes NOR-type and NAND-type. NOR-type ROM is formed by connecting in parallel the sources and the drains of the memory transistors. Alternatively, connecting the sources and the drains of the memory transistors in series forms a NAND-type ROM.

Figure 1:
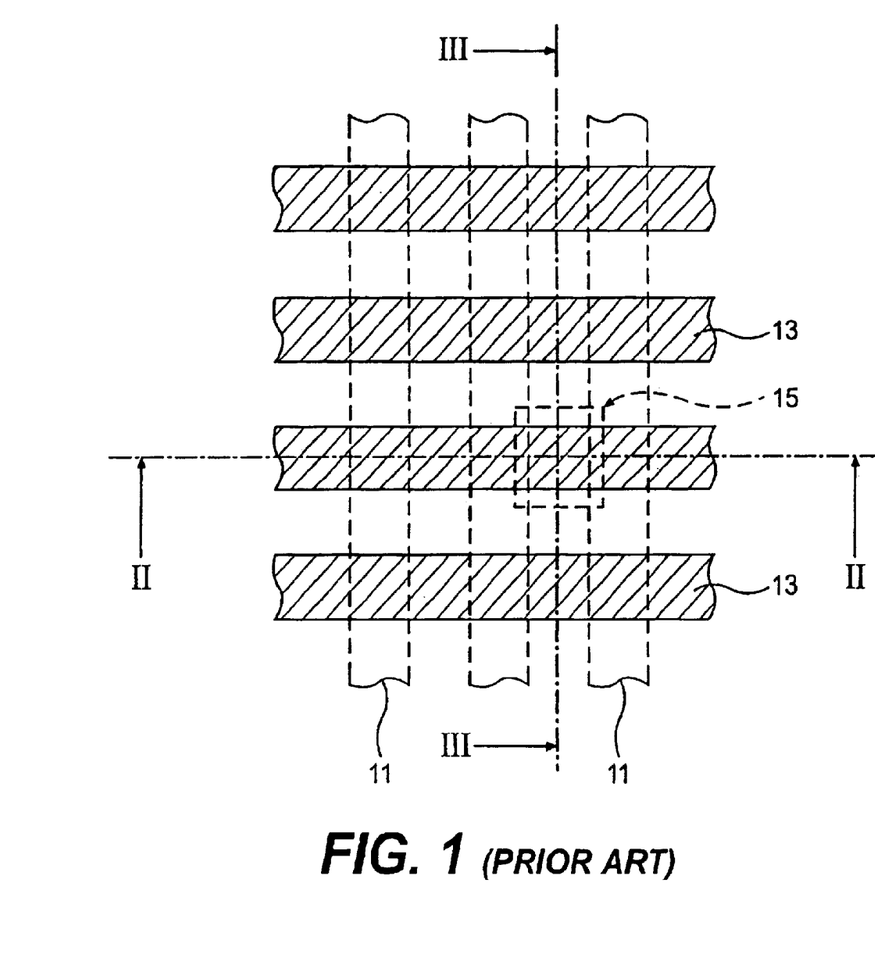
FIG. 1 is a top view of a prior art ROM device.
Figure 2:
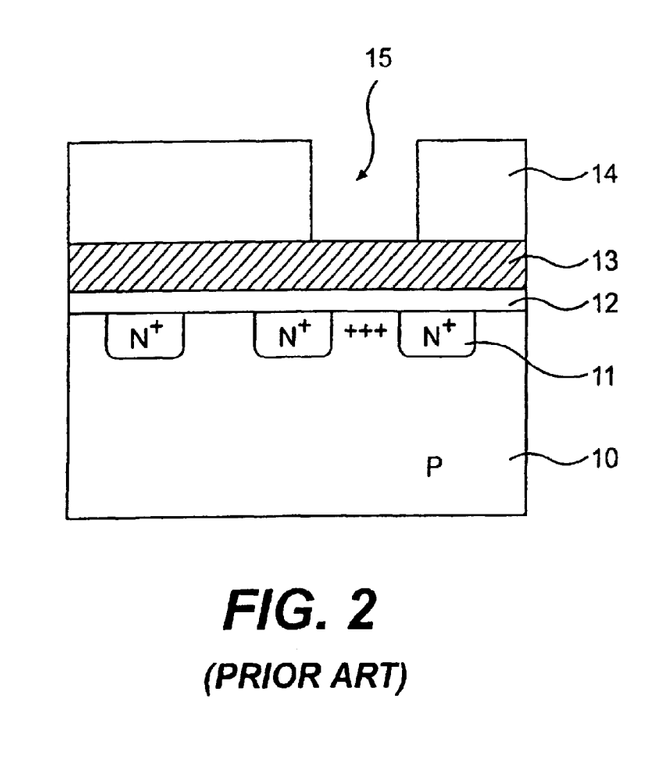
FIG. 2 is a cross-sectional view of a prior art ROM device taken along line II—II of FIG. 1.
Figure 3:
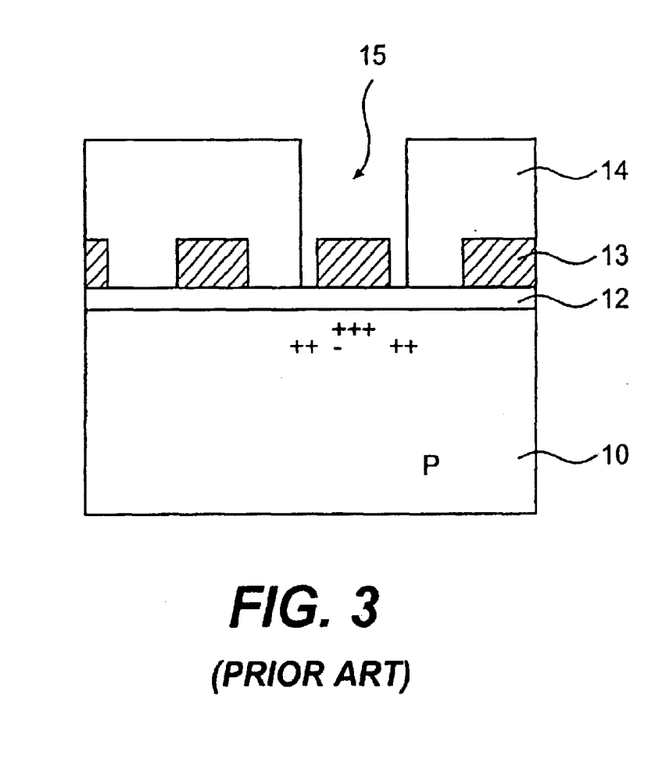
FIG. 3 illustrates another cross-sectional view of a prior art ROM device taken along line III—III of FIG. 1

As shown in FIGS. 1–3 fabrication of a conventional flat-cell mask ROM begins with a semiconductor silicon substrate (10) doped with P-type impurities. Buried bit lines (11) that will constitute source/drain regions are formed by implanting N-type impurities into multiple parallel strip shaped regions of the substrate. A gate oxide layer (12), typically silicon oxide formed by thermal oxidation, is then formed over the substrate (10). Gate electrodes (13) are then formed orthogonal to the buried bit lines (11), constituting word lines for the memory array of the mask ROM device. Conventional coding procedure requires that a photoresist layer (14) be applied covering the surface of the substrate (10) while leaving the coding openings (15) exposed. Impurity ions are then implanted into the exposed channel regions of the selected memory cells.

The channel regions for the memory cell transistors lie in the region of the substrate between every two adjacent bit lines beneath the word lines. The memory cell transistors are coded as either blocking or conducting. A 1 or 0 data bit can be defined as either state. If a cell is implanted with P-type impurities, the cell is set to have a high threshold voltage effectively setting the memory cell to a permanently OFF state representing, for example, the storage of binary digit of 0. Cells without implanted impurities have a low threshold voltage setting the memory cell to an ON state when the word line voltage is high representing, for example, the storage of a binary 1.

As a result of semiconductor device manufacturers striving to improve performance and reduce cost, the size of ROM devices continues to shrink while the density of ROM devices continues to increase. Conventional ROM devices, however, suffer from higher word line and bit line resistance as line width is decreased due to device miniaturization. This adversely affects the ROM device's operational speed.

One solution to this problem is to use thin film refractory metal silicides to reduce resistance of the word lines and bit lines. Application of suicides in a Self-ALIgned siliCIDE (SALICIDE) process allows the formation of low resistance source, gate, and drain contacts which can reduce the resistance of bit lines and word lines compared to a non-silicide structure. Salicide processes, however, require additional steps to be incorporated into the manufacturing process.

U.S. Pat. No. 5,633,187 to Hsu discloses a salicide process to fabricate ROM with reduced bit line and word line resistance. The process disclosed by Hsu, however, requires the formation of two silicide layers. Hsu discloses depositing a tungsten silicide layer over the word lines followed by depositing a titanium silicide layer over the bit lines.

U.S. Pat. No. 5,712, 203 to Hsu discloses another salicide process for fabricating ROM with reduced bit line resistance. Although this process requires forming only one silicide layer, only bit line resistance is reduced.

In light of the foregoing, there is a need for a salicide process that can be easily incorporated into the manufacturing process of ROM devices to provide lower bit line and word line resistance.

SUMMARY OF THE INVENTION

Accordingly, the present invention is directed to method for manufacturing a mask programmable ROM including the steps of forming an oxide layer with a thickness greater than about 1000 Å on a semiconductor substrate, forming a first mask layer over the oxide layer and patterning the first mask layer to form bit lines, removing regions of the oxide layer within the bit lines to expose the semiconductor substrate, ion implanting conductivity imparting dopants into the exposed substrate to form buried bit line regions, removing the first mask layer and forming a second mask layer, printing a code pattern and forming coding openings that expose portions of the substrate between the bit lines, removing the second mask layer, growing a gate oxide within the coding openings, depositing a conducting layer on remaining regions of the oxide layer, the buried bit line regions, and the gate oxide, forming a plurality of conducting gate structures constituting word lines for the mask ROM, and forming a salicide layer on the buried bit lines and the word lines by depositing single layer of refractory metal.

In another embodiment, the present invention is directed to a read-only memory device including a plurality of parallel bit lines formed in a substrate, a plurality of word lines perpendicular to and above the bit lines, and a plurality of memory cells formed at a junction of two adjacent bit lines and a portion of one word line. A silicide layer covers portions of the bit lines between two adjacent word lines.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

FIGS. 11 B–D are cross-sectional views along lines B—B, C—C, and D—D of FIG. 4, respectively, further illustrating this step.

DETAILED DESCRIPTION OF THE PREFERRED EMBODIMENTS

Reference will now be made in detail to the preferred embodiments of the invention, examples of which are illustrated in the accompanying drawings.

Figure 5A:
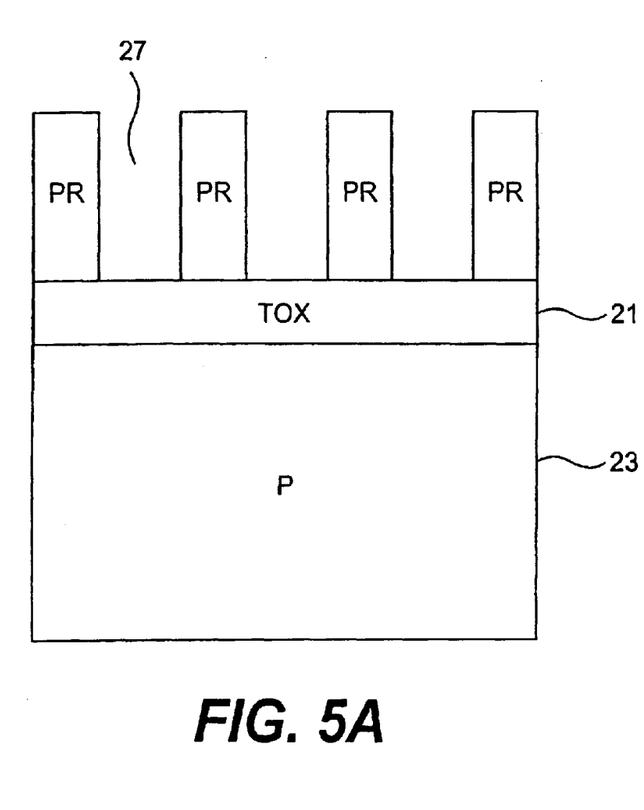
FIG. 5A is a cross-sectional view along line A—A of FIG. 4 that schematically illustrates the step of forming a thick oxide layer on the cell area and printing a bit line pattern according to the present invention.
Figure 5B:
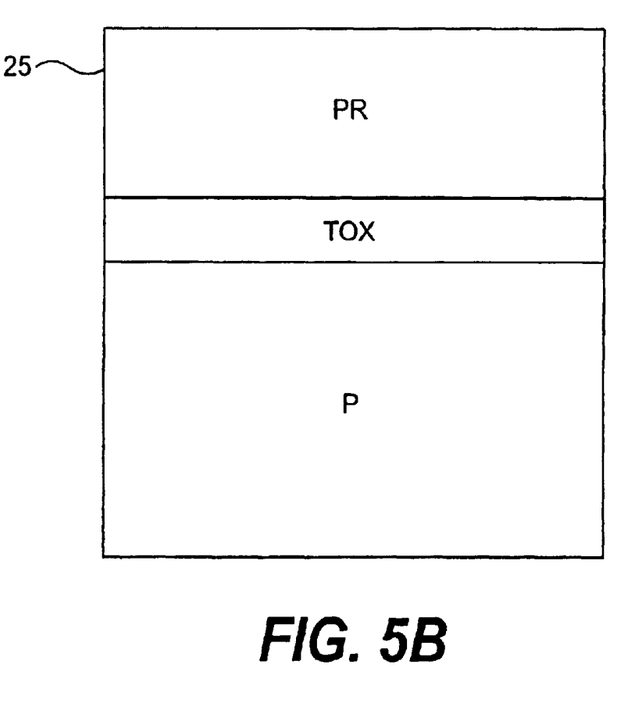
FIG. 5B is a cross-sectional view taken along line B—B of FIG. 4 further illustrating this step.

As shown in FIGS. 5A–B, a thick oxide layer (TOX) (21) is deposited to a thickness of at least 1000 Å over a P-type silicon semiconductor substrate (23). The thickness of the TOX layer is approximately ten times the thickness of a 100 Å gate oxide. If the difference between the thicknesses of the TOX and the gate oxide is not great enough, it becomes difficult to distinguish between data bits programmed as 1 and 0. The thick oxide layer may be thermally grown or deposited by conventional techniques such as low pressure vapor deposition. Formation of a continuous thick oxide layer in this manner avoids lateral growth of the oxide and, the subsequent formation of a "bird's beak." For example, a field oxide layer avoids formation of a "bird's beak" in the memory area, since the oxide is grown over the entire memory area. Therefore, a "bird's beak" will only form at the border of the memory. Similarly, formation of a continuous thick oxide layer by, for example, low pressure CVD avoids formation of a "bird's beak" altogether.

A photoresist layer (PR) (25) is then coated on the surface of the thick oxide layer (21) and patterned by a conventional photolithography process to form multiple parallel strip-shaped openings (27) that define the bit lines (29) that will serve as the source/drain regions for the memory cell transistors.

Figure 6A:
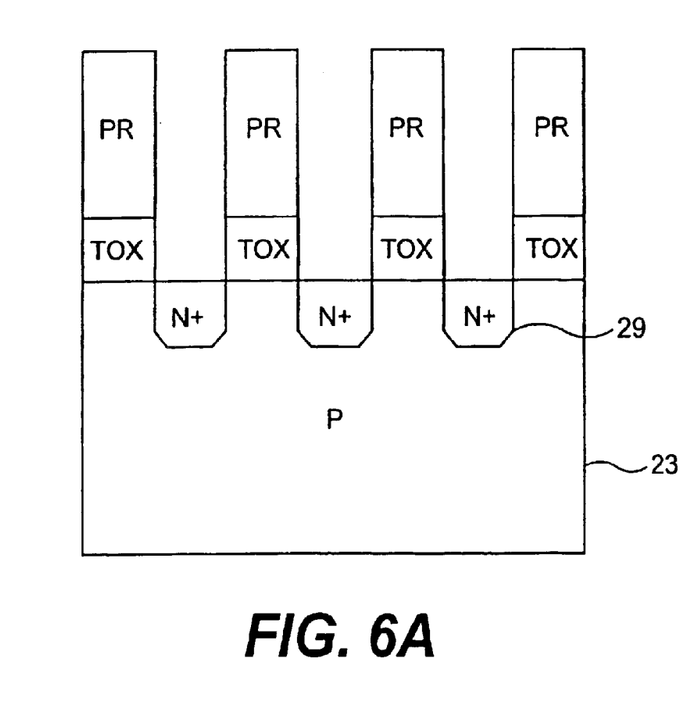
FIG. 6A is a cross-sectional view along line A—A of FIG. 4 schematically illustrating the step of etching away oxide above the bit line area and implanting N+ impurities to form buried bit lines.
Figure 6B:
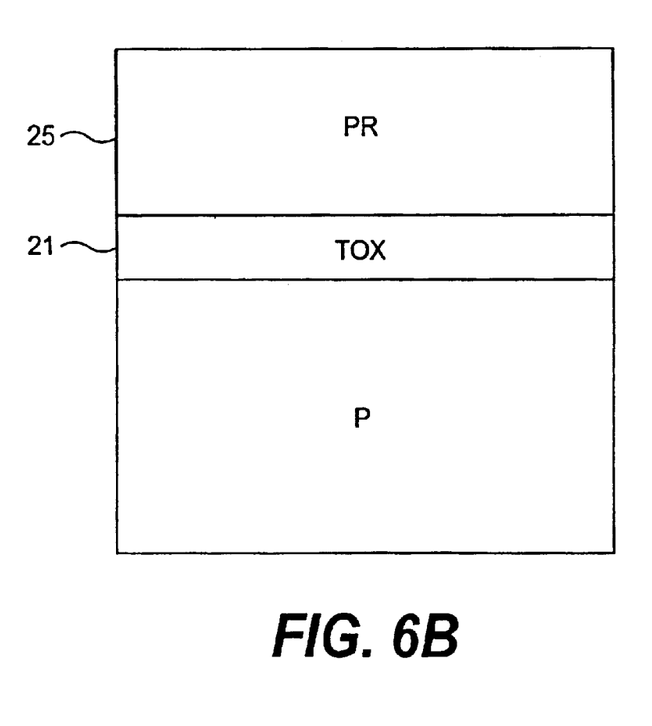
FIGS. 6B–D are cross-sectional views along lines B—B, C—C, and D—D of FIG. 4, respectively, further illustrating this step.
Figure 6C:
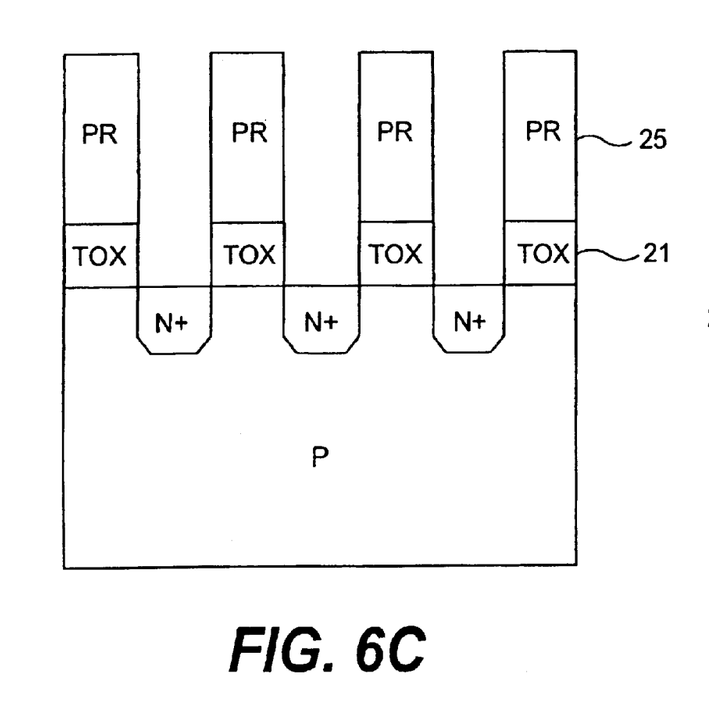
Figure 6D:
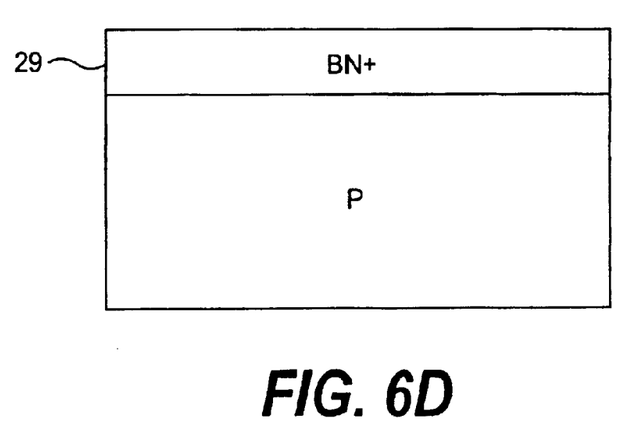
Figure 7A:
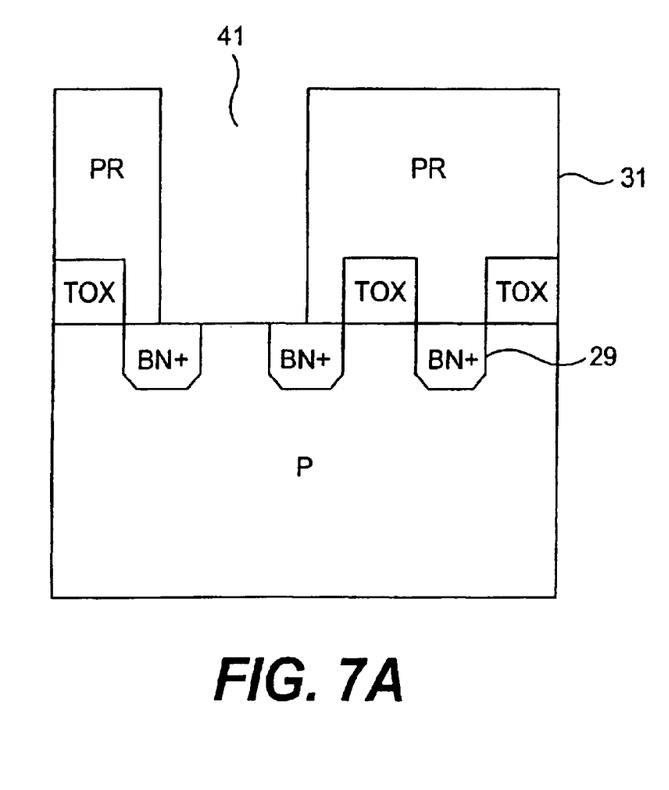
FIG. 7A is a cross-sectional view along line A—A of FIG. 4 schematically illustrating the step of printing a code pattern and etching away the oxide within the code area.
Figure 7B:
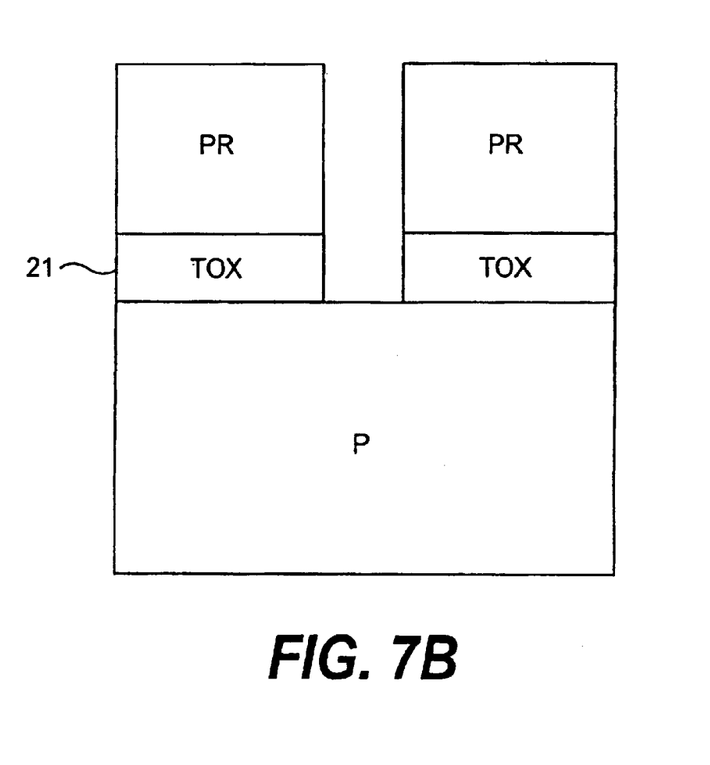
FIGS. 7B–D are cross-sectional views along lines B—B, C—C, and D—D of FIG. 4, respectively, further illustrating this step.
Figure 7C:
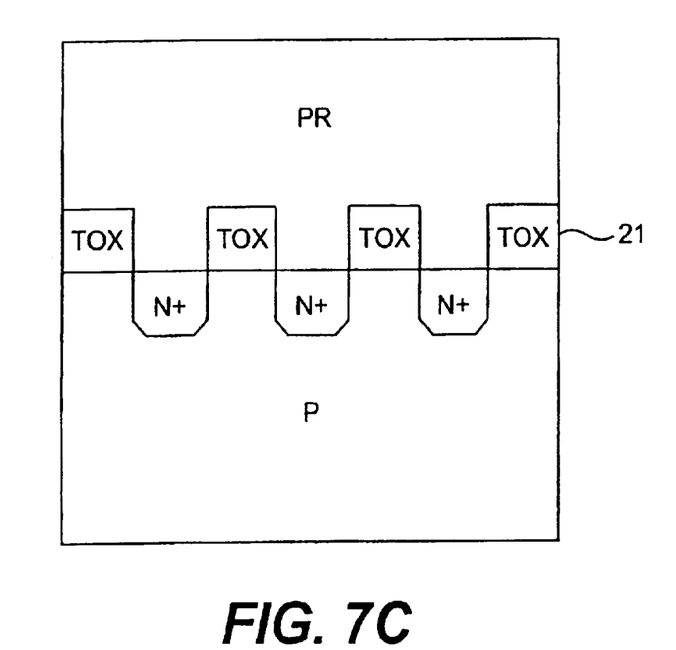
Figure 7D:
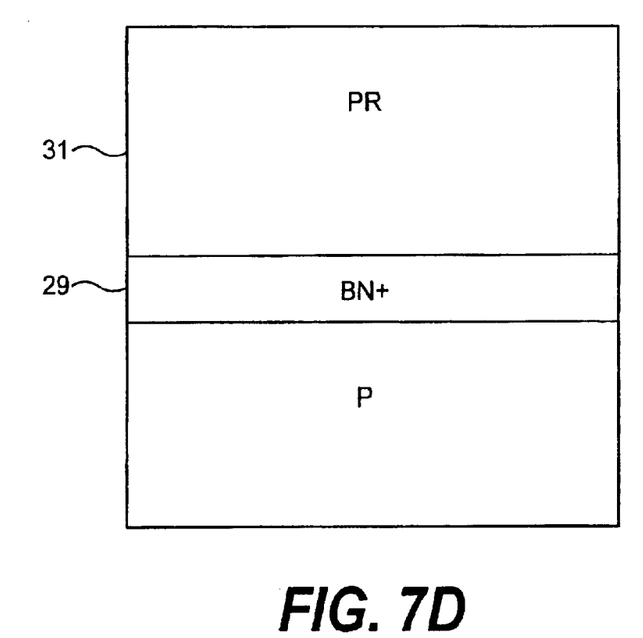

Next, referring to FIGS. 6A–D and 7A–D, the oxide layer within the bit line areas is etched away to reveal the underlying substrate. Convention anisotropic etching techniques such as reactive ion etching are preferred. The photoresist layer is then used as a mask for ion implantation of N+ impurities, such as arsenic or phosphorus. Arsenic impurities may be implanted at an energy of about 60 to 120 keV in doses of approximately $5 \times 10^{14}$ to $5 \times 10^{15}$. Phosphorus impurities may be implanted at an energy of about 30 to 70 keV in doses of approximately $5 \times 10^{14}$ to $5 \times 10^{15}$. As shown in FIGS. 6A and 6C, the N+ regions (29) formed by implantation in the exposed areas of the substrate form the buried bit lines of the ROM device.

Figure 8A:
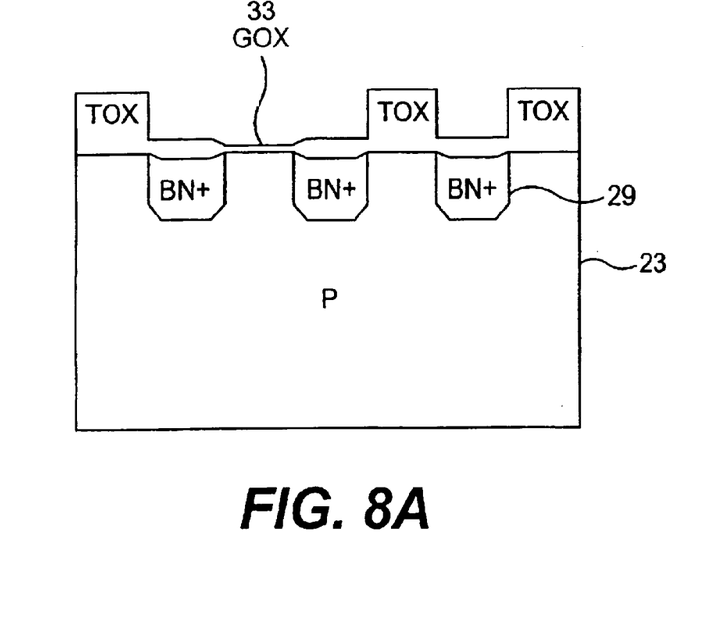
FIG. 8A is a cross-sectional view along line A—A of FIG. 4 schematically illustrating the step growing a gate oxide.
Figure 8B:
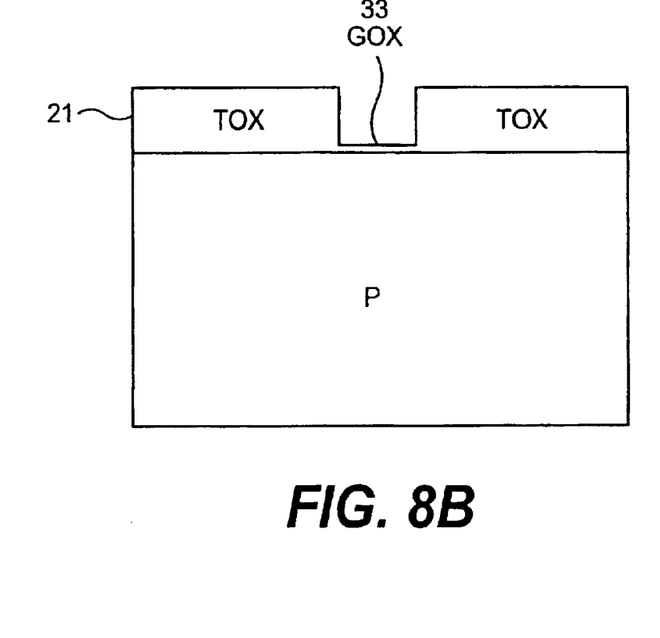
FIGS. 8B–D are cross-sectional views along lines B—B, C—C, and D—D of FIG. 4, respectively, further illustrating this step.
Figure 8C:
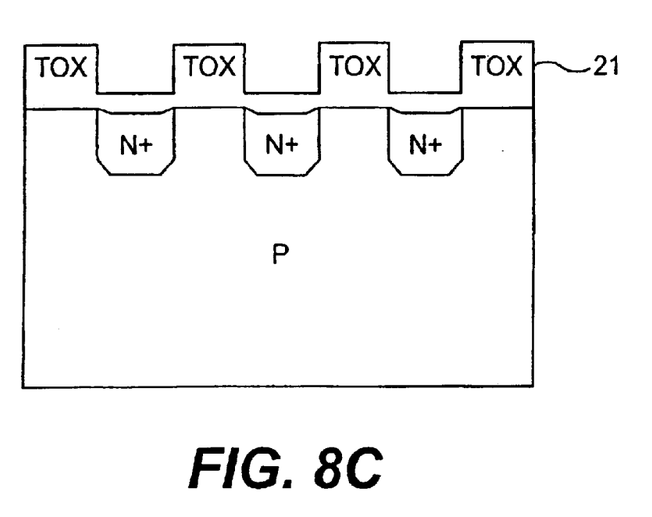
Figure 8D:
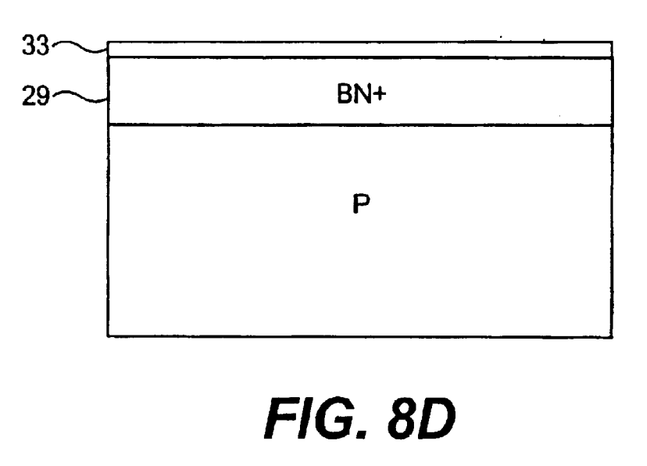
Figure 9A:
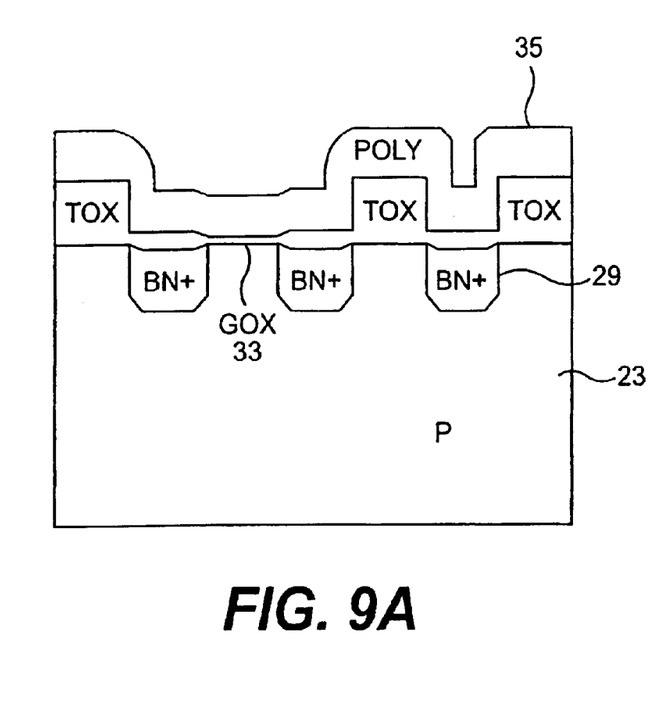
FIG. 9A is a cross-sectional view along line A—A of FIG. 4 that schematically illustrates the step of depositing and patterning the polysilicon gate electrodes.
Figure 9B:
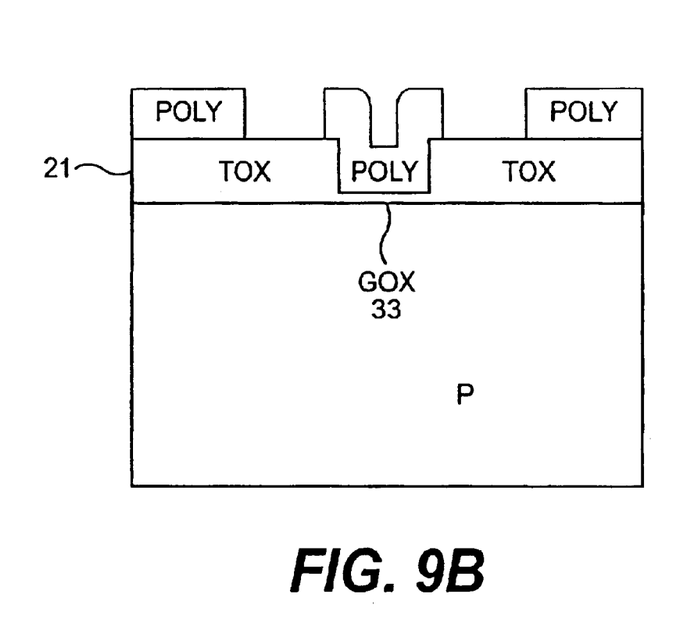
FIGS. 9B–D are cross-sectional views along lines B—B, C—C, and D—D of FIG. 4, respectively, further illustrating this step.
Figure 9C:
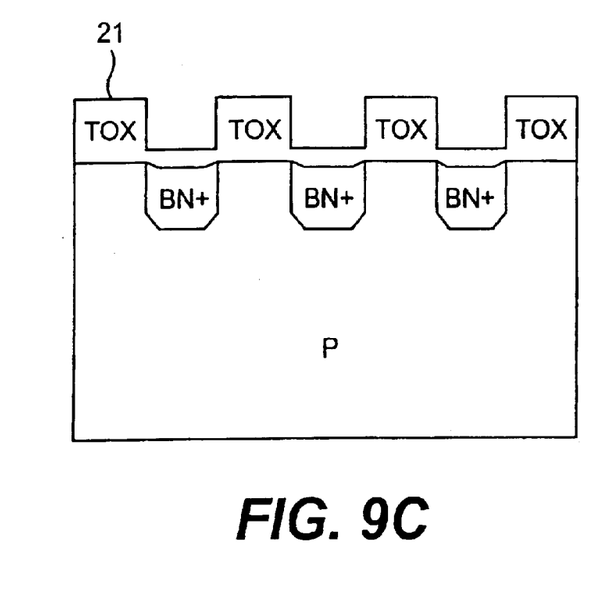
Figure 9D:
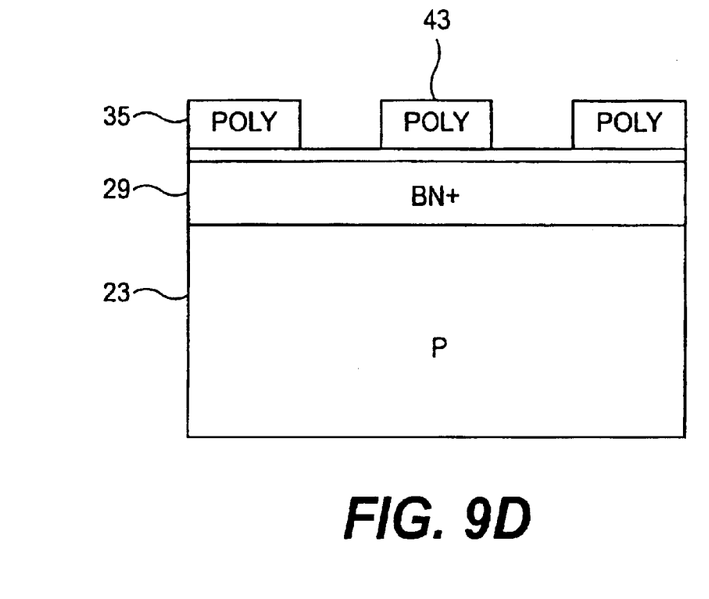
Figure 10A:
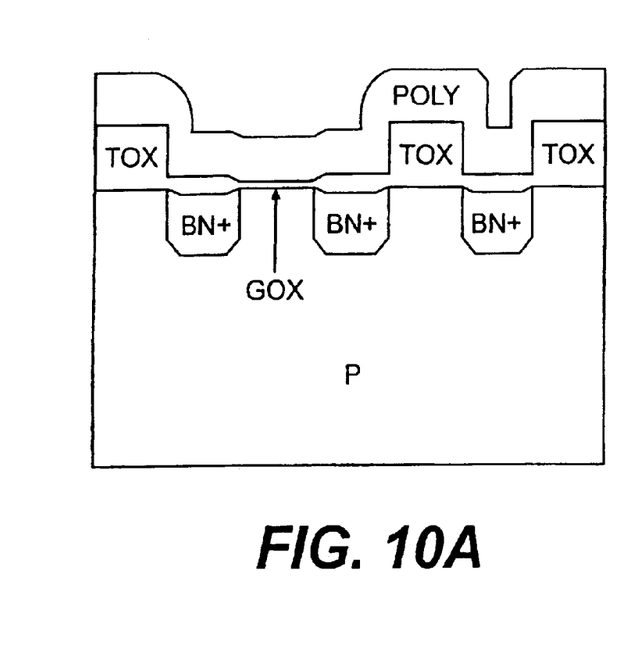
FIG. 10A is a cross-sectional view along line A—A of FIG. 4 that schematically illustrates the step of forming the spacers.
Figure 10B:
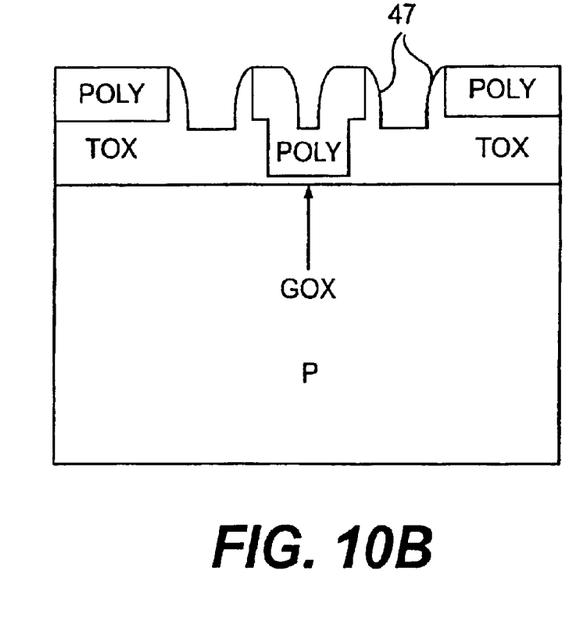
FIGS. 10B–D are cross-sectional views along lines B—B, C—C, and D—D of FIG. 4, respectively, further illustrating this step.
Figure 10C:
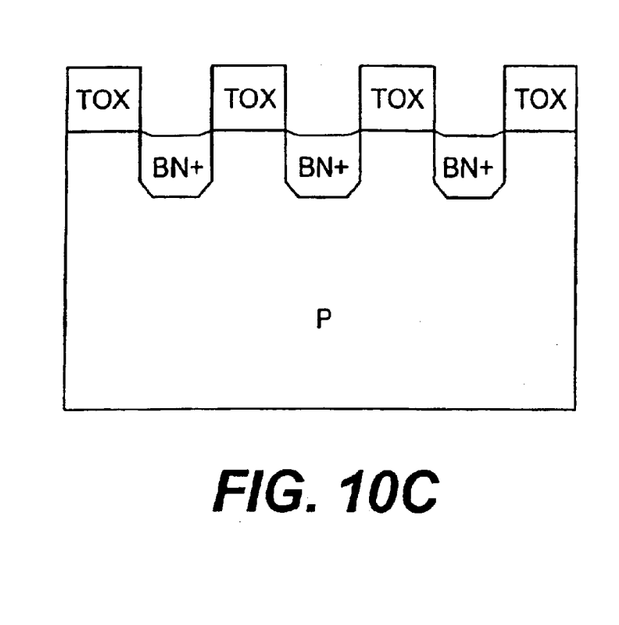
Figure 10D:
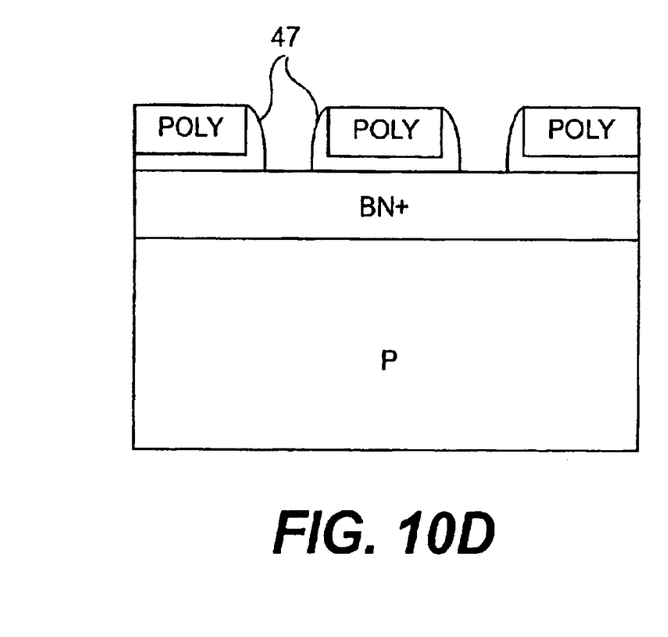

After removal of the first photoresist layer, a second photoresist layer (31) is applied and patterned to expose areas of the substrate that will constitute the channel regions of the cells that can be set to an ON state when the word line voltage is high. Photolithography is then utilized to define coding openings (41) in this photoresist layer. This is illustrated in FIGS. 7A–D. Coding openings selectively expose the substrate surface, allowing subsequent formation of a thin gate oxide (33) on the exposed surface. The second photoresist layer is then removed. The first and second photoresist layer can be removed by, for example, applying solvents known in the art. Conventional techniques are then used to grow the gate oxide and its thickness depends on the process being used. Formation of the gate oxide is shown in FIGS. 8A–D. As shown in FIG. 8A, the thickness of the gate oxide layer is thicker over the BN+ regions. This is due to the faster oxidation rate of the doped silicon which results in higher dopant density and, thus, a thicker oxide.

The word line structure is then formed, as shown in FIGS. 9A–D, by depositing a blanket polysilicon (35) layer over the remaining portions of the thick oxide and the gate oxide layer. Deposition of the polysilicon may be by low vapor chemical vapor deposition or any other technique know in the art to a thickness of about 2000 to 4000 Å. Photolithography is then used to form a plurality of gate electrodes (43) that constitute word lines for the memory array of the mask-type ROM device.

Spacers (47) are then formed to protect the gate sidewalls from the silicide layer as shown in FIGS. 10A–D. An insulating layer (not shown) is first deposited and anisotropic etching is then used to form the spacers (47). The insulating layer can be, for example, silicon dioxide ($SiO_2$) deposited to a thickness of about 1000 Å to 2000 Å. The insulating layer can then be etched back using, for example, reactive ion etching.

The salicide process follows as shown in FIGS. 11A–D. A thin refractory metal layer of, for example, titanium is deposited to a thickness of about 300 to 400 Å. Heat treating at a temperature between 600° C. to 900° C. in a nitrogen atmosphere follows. In areas where the titanium is in direct contact with portions of the buried bit lines and the polysilicon, a silicide layer (51) is formed. In the case of a titanium layer, a $TiSi_2$ silicide layer forms. In the other areas, the titanium reacts to form titanium nitride (TiN) or oxynitride ($TiO_xN_y$). Unreacted titanium and the titanium nitride or oxynitride is then selectively etched by a hot sulfuric acid solution that etches the Ti, TiN, and $TiO_xN_y$ faster than it etches $TiSi_2$. Thus, the above described salicide process allows a silicide layer (51) to be formed over the word lines and portions of the buried bit lines of the ROM device and requires the deposition of only one refractory metal layer.

Figure 4:
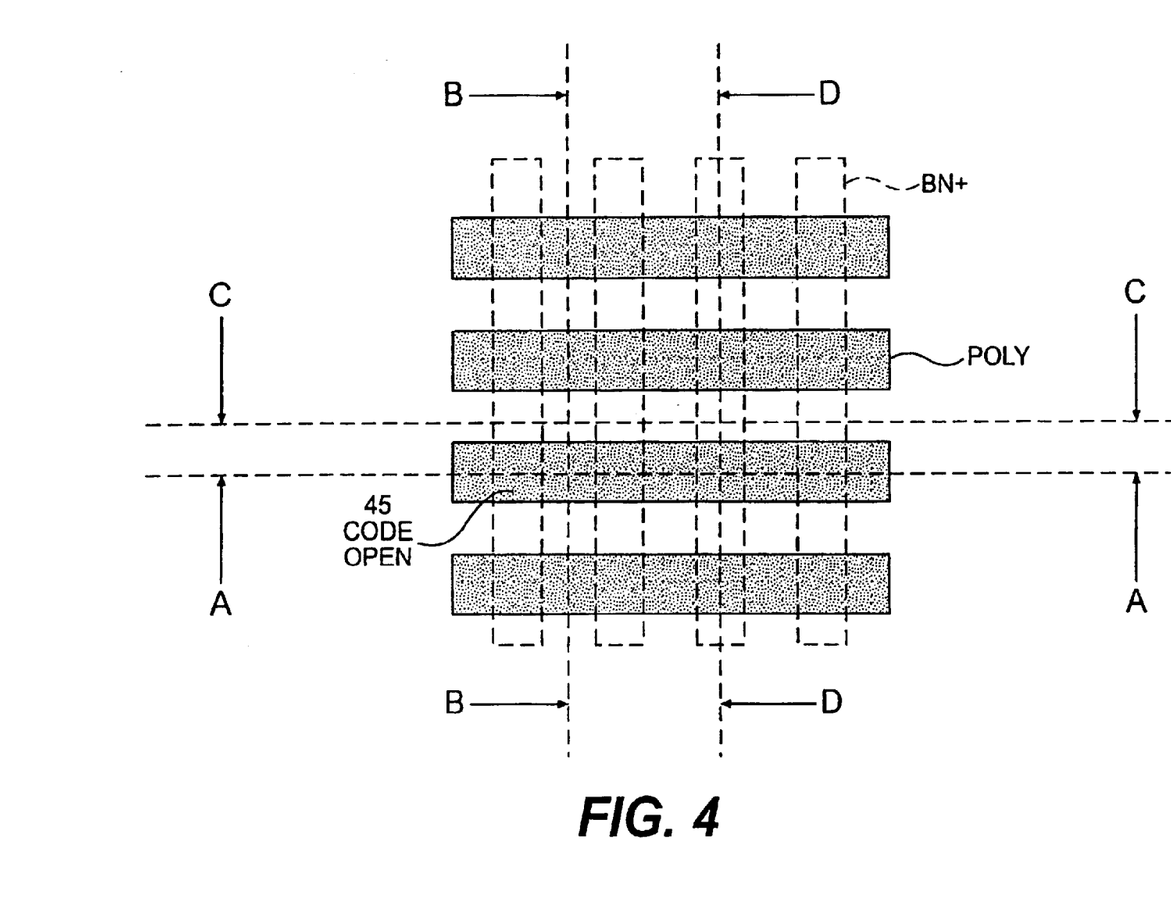
FIG. 4 is a top view that schematically depicts the memory cells of the mask ROM fabricated in accordance with a preferred embodiment of the present invention.
Figure 11A:
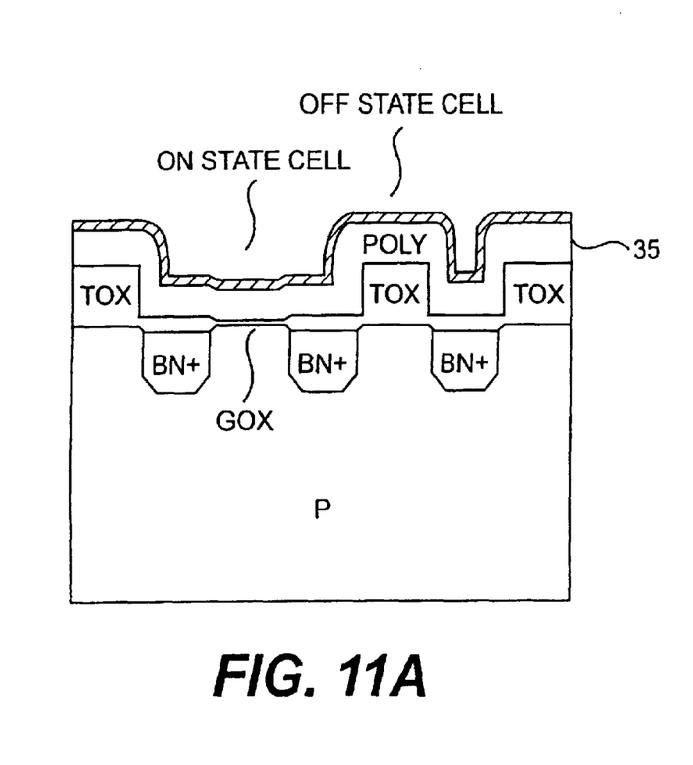
FIG. 11A is a cross-sectional view along line A—A of FIG. 4 that schematically illustrates the step of forming the salicide layer.
Figure 11B:
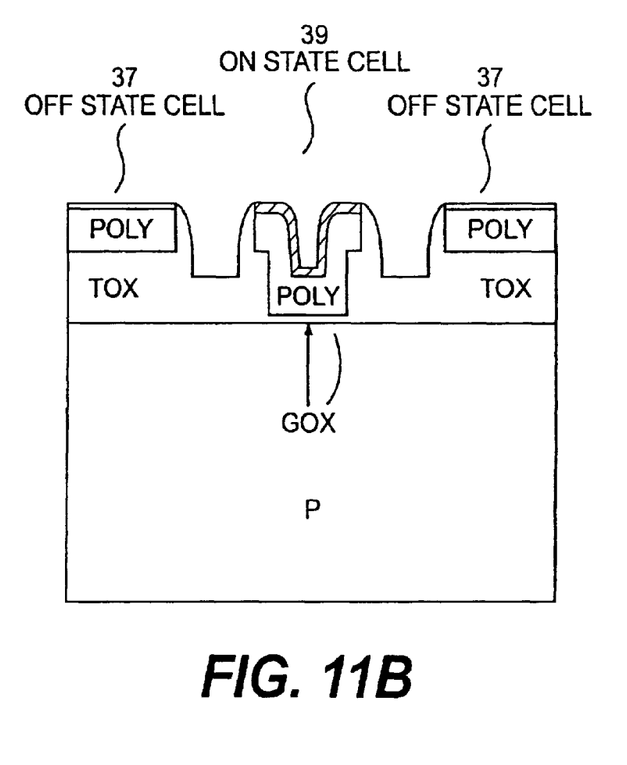
Figure 11C:
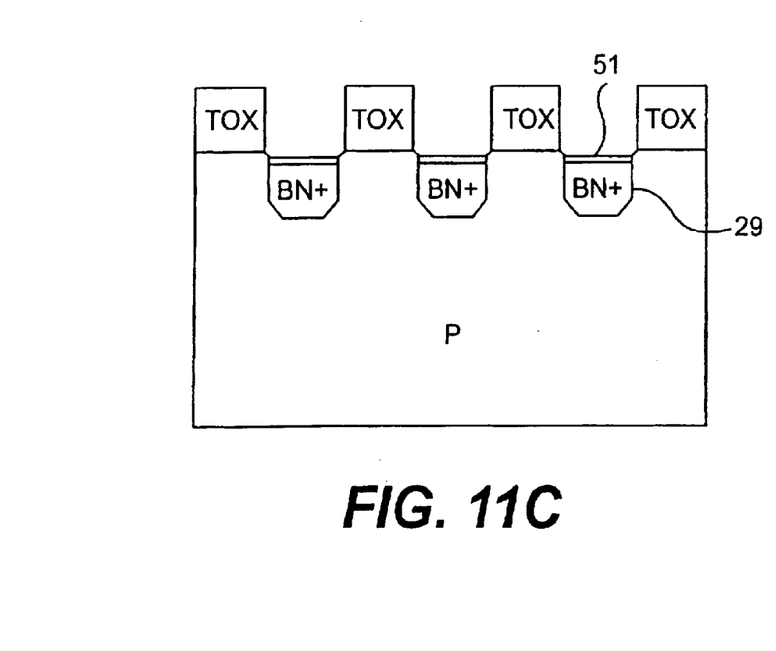
Figure 11D:
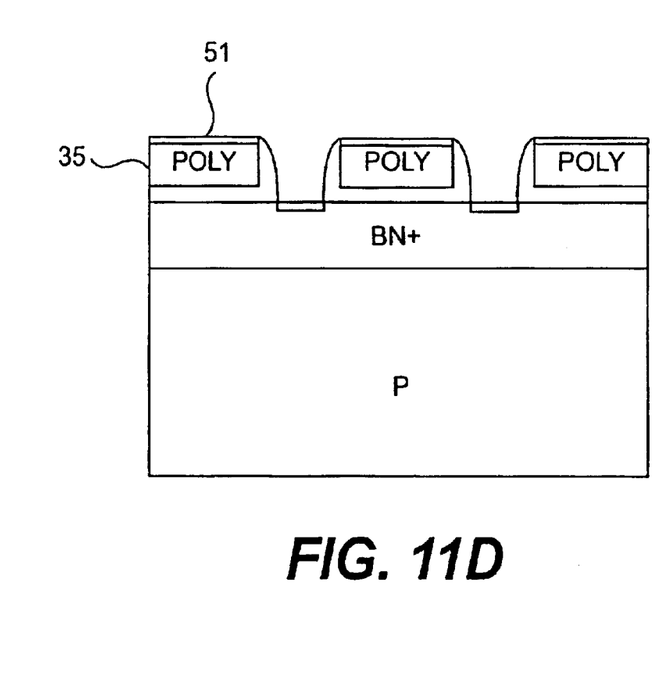

As shown by FIGS. 4 and 11D, memory cells (45) for the ROM device are located at the intersection of a word line and two adjacent bit lines. OFF state memory cells have high threshold voltage due to the patterned thick oxide (37) in the channel region. These memory cells will remain in the OFF state regardless of whether the word line voltage is high or low. The memory cells with code open have a gate oxide (39) of normal thickness. Memory cells with a normal thickness gate oxide can then be set to an ON state when the word line voltage is high. The ROM device in accordance with the principles of the present invention has a silicide layer over the word lines and portions of the buried bit lines. Since the silicide layer is deposited in a single step, it can be easily incorporated into the manufacturing process. Furthermore, the silicide layer reduces electrical resistance in both the word lines and bit lines resulting in improved operating speeds of the memory cells.

It will be apparent to those skilled in the art that various modifications can be made in the ROM device and its method of manufacture of the present invention without departing from the spirit or scope of the invention. Thus, it is intended that the present invention cover the modifications and variations of this invention provided they come within the scope of the appended claims and their equivalents.

What is claimed is:

1. A read-only memory device comprising:
   a plurality of parallel bit lines formed in a substrate;
   a plurality of word lines perpendicular to and above the bit lines;
   an oxide layer between the plurality of word lines and the substrate
   the oxide layer comprising:
   a first portion on the bit lines,
   a second portion between the bit lines, and
   a third portion in a code opening,
   wherein the second portion of said oxide layer is thicker than the first portion; and
   a plurality of memory cells each formed at a junction of two adjacent bit lines and a portion of one word line.

2. The read-only memory device of claim 1, wherein a silicide layer covers the word lines.

3. The read-only memory device of claim 1, wherein a silicide layer covers portions of the bit lines between two adjacent word lines.

4. The read-only memory device of claim 1, wherein the second portion of said oxide layer is greater than 1000 Å thick.

5. The read-only memory device of claim 1, wherein the second portion of said oxide layer is approximately 10 times the thickness of the third portion of said oxide layer.

* * * * *